United States Patent [19]

Fowler

[11] 4,286,213
[45] Aug. 25, 1981

[54] ENERGY SENSOR

[75] Inventor: Thomas P. Fowler, Madison, Wis.

[73] Assignee: Research Products Corporation, Madison, Wis.

[21] Appl. No.: 21,721

[22] Filed: Mar. 19, 1979

[51] Int. Cl.³ .............................................. G01R 31/02
[52] U.S. Cl. .................................................... 324/127
[58] Field of Search ........................................ 324/127

[56] References Cited

U.S. PATENT DOCUMENTS

| | | |
|---|---|---|
| 2,175,934 | 10/1939 | Wentz . |
| 2,273,534 | 2/1942 | Mitchell . |
| 2,291,013 | 7/1942 | Wheeler . |
| 2,375,591 | 5/1945 | Schweitzer, Jr. . |
| 2,494,206 | 1/1950 | Ross . |
| 2,501,558 | 3/1950 | Williams . |
| 2,709,800 | 5/1955 | Temple et al. ......................... 324/127 |
| 2,913,689 | 11/1959 | Enikeieff . |
| 3,056,922 | 10/1962 | Du Val et al. ......................... 324/127 |
| 3,725,832 | 4/1973 | Schweitzer . |

OTHER PUBLICATIONS

EE, vol. 39, No. 3, Mar. 1979, A Sutton Publication, USPS-814-240, Circle 1 and 5 on Reader Service Card.
Machine Design, p. 150, Mar. 1979, Circle 614 entitled, "Current Sensor".

Primary Examiner—Michael J. Tokar
Attorney, Agent, or Firm—Andrus, Sceales, Starke & Sawall

[57] ABSTRACT

A removable energy sensor for sensing the flow of electrical energy through a current carrying conductor. A magnetic flux conducting circuit includes a U-shaped bracket providing an opening for removably retaining a conductor while a removable pin is retained within openings at the outer portion of the bracket legs for securing a coil wound bobbin between such legs and for providing a coil surrounding such pin. The removable coil wound bobbin includes an insulator which cooperates with a similarly constructed insulator retained by the U-shaped bracket for sandwiching the electrical lead and maintaining such lead in spaced, isolated relationship with respect to the flux conducting circuit and the sensing coil.

6 Claims, 6 Drawing Figures

ENERGY SENSOR

BACKGROUND OF THE INVENTION

This invention relates to a removable energy sensor for monitoring the flow of electrical energy through a current carrying conductor.

A large number of energy sensors have employed movable elements for surrounding a monitored conductor to form a flux conducting circuit thereabout for monitoring the energy flow through such conductor. For example, split-core type transformers have long been used for a variety of applications.

Many of such prior sensors retain electrical output or secondary coils in a permanent, fixed relationship with respect to the flux conducting members. Furthermore, many of such constructions would be undesirable for extremely sensitive current monitoring and have been expensive and cumbersome to use.

SUMMARY OF THE INVENTION

This invention relates to a removable energy sensor for monitoring the flow of electrical energy through a current carrying conductor.

A magnetic flux conducting circuit provides a first flux conducting portion for removably retaining the conductor while a second flux conducting portion is movably connected to the first portion and operatively forms a closed loop for conducting magnetic flux about the conductor in response to the current flow through such conductor. A coil of electrically conductive wire having at least one output lead surrounds the movable flux conducting portion and provides an output signal in response to the flux which is substantially proportional to the current flow in the conductor. Both the coil and the second flux conducting portion are selectively movable with respect to the first flux conducting portion for removably positioning to the conductor within the opening.

A U-shaped magnetic flux conducting member provides a base portion joined with a pair of spaced outwardly directed legs to form a channel therebetween for removably retaining the current carrying conductor. Another flux conducting member is movably retained by the legs and operatively provides a flux conducting circuit with the U-shaped member. A coil wound bobbin provides an opening which is removably retained by the flux conducting movable member. The bobbin is surrounded by a current carrying coil having at least one output lead. Electrical insulation is provided to electrically insulate the flux conducting circuit from the current carrying conductor and the coil so that the output lead provides a highly sensitive electrical output signal which is substantially proportional to the current within the monitored conductor.

The coil wound bobbin includes an electrical insulating coil form carrying the coil about an opening therein. The coil wound bobbin is removably retained between the pair of spaced legs with each of the legs containing an opening aligned with each other and with a coil form opening. The movable flux conducting member includes a pin which is removably positioned within the leg openings and the coil form opening and operatively forming the flux conducting loop.

An electrical insulator is connected to the removable coil wound bobbin and removably engages a second similarly constructed electrical insulator connected to the U-shaped member so that such pair of insulators sandwich the current carrying conductor in electrical isolation from the flux conducting loop and the coil.

The coil wound bobbin provides an electrically insulating coil form having a central core surrounding a central opening together with a pair of spaced end members extending outwardly beyond the core and providing a retaining channel for securing the coil about the core opening. A first insulating tape engages the outer periphery of the coil and substantially encloses the channel. A metal foil substantially surrounds the first tape while a second tape substantially surrounds the metal foil for superb electrical isolation of the coil.

The removable energy sensor provides a simple and easy manner of quickly and economically connecting the assembly to monitor the current flow in a conductor without disfiguring or damaging such conductor. The energy sensor is formed in a compact module and may be readily disassembled and assembled.

BRIEF DESCRIPTION OF THE DRAWING

The drawing furnished herewith illustrates a preferred construction of the present invention in which the above advantages and features are clearly disclosed as well as others which will be clear from the following description.

In the drawings.

DESCRIPTION OF THE PREFERRED ILLUSTRATED EMBODIMENT

Figure 1:
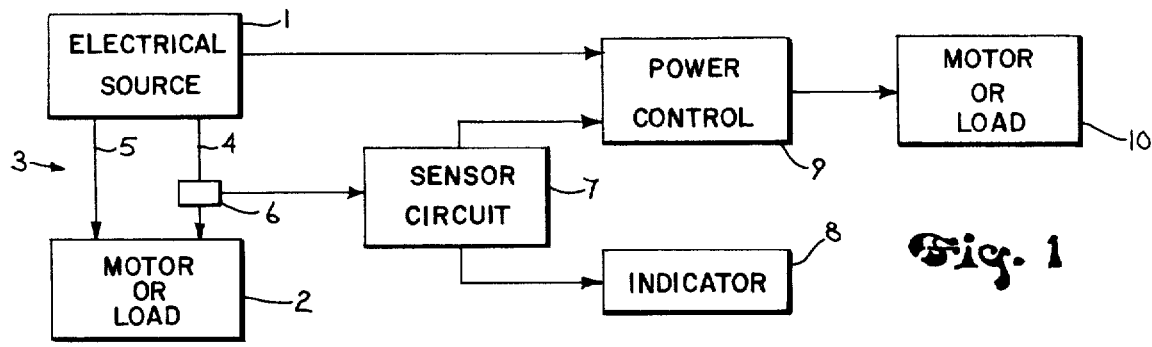
FIG. 1 is a diagrammatical block illustration of a system which senses the energy flow in a primary power transfer circuit for controlling the energy flow in a secondary power transfer circuit and for providing an indication of the status of the primary power transfer.
Figure 2:
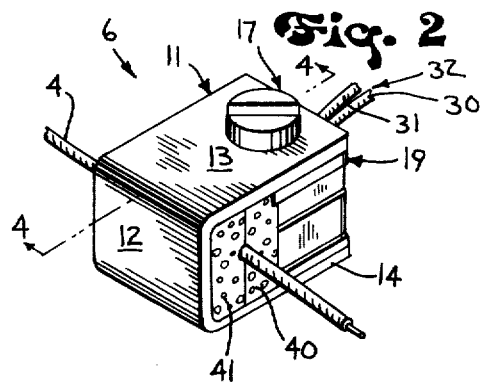
FIG. 2 is a perspective view of an energy sensor which is used in the system of FIG. 1.
Figure 3:
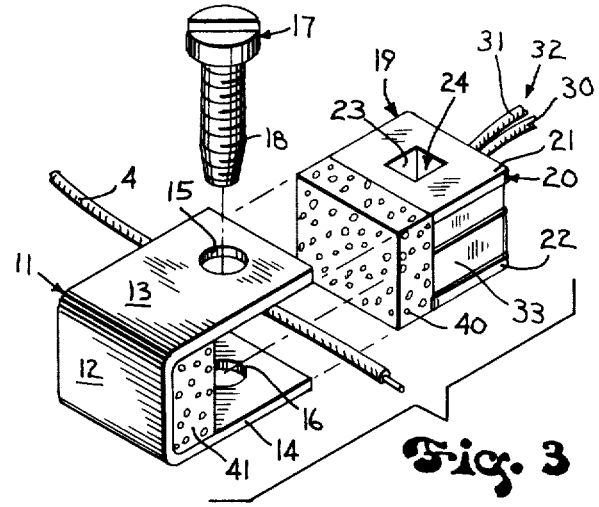
FIG. 3 is an exploded view of the sensor of FIG. 2.
Figure 4:
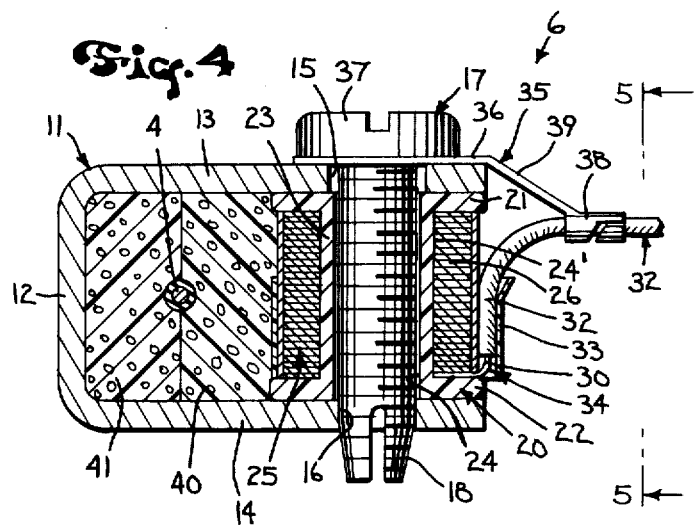
FIG. 4 is a sectional view taken along lines 4—4 in FIG. 2.
Figure 5:
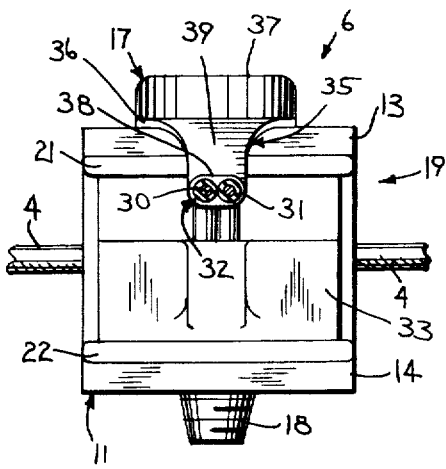
FIG. 5 is an end view taken along lines 5—5 in FIG. 4.
Figure 6:
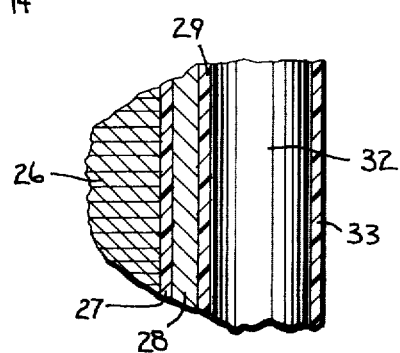
FIG. 6 is an exploded partial view of a portion of the sensor of FIG. 4.

Referring to the drawing and particularly FIG. 1, an electrical source 1 selectively supplies A.C. energizing power to a motor or load 2 through a connecting circuit 3. The circuit 3 may contain a plurality of leads and FIG. 1 illustrates a power conducting lead 4 and a common or neutral lead 5. A sensor 6 is connected to magnetically sense the energy flow through lead 4. An output of sensor 6 is supplied to a sensor circuit 7 which responds to the presence or absence of energy flow through lead 4. An indicator 8 is operated by sensor circuit 7 to reflect the operating condition of energy through lead 4. A power control 9 is controlled by sensor circuit 7 in response to the output of sensor 6 for selectively conducting energizing power between the electrical source 1 and a motor or load 10. One highly desirable sensor circuit 7 and indicator 8 is disclosed in the co-pending application of Thomas P. Fowler entitled Load Indicator For An Air Cleaner filed on even date herewith, and is incorporated by reference herein. One highly desirable sensor circuit 7 and power control 9 is disclosed in the co-pending application of Thomas P. Fowler entitled Humidifier Control, filed on even date herewith, and is incorporated by reference herein.

The sensor 6 includes a U-shaped bracket 11 formed of good magnetic flux conducting material. The bracket 11 provides an inner end closed by a base portion 12 which joins a pair of spaced, outwardly directed legs 13 and 14 terminating in an open outer end remote from base portion 12. A pair of spaced openings 15 and 16 are formed in alignment in the pair of spaced legs 13 or 14, respectively, and removably retain a securing bolt or screw 17. The opening 15 is generally larger than the diameter of screw 17 while opening 16 is threaded to rigidly engage and securely retain an outer threaded end 18 of screw 17.

A bobbin 19 is formed of good electrical insulating material and includes an H-shaped base 20 having a pair of spaced axial ends 21 and 22 integrally joined by a central core 23 surrounding a central opening 24. The core 23 provides an outer circumferential surface 24' which, together with the pair of spaced axial ends 21 and 22, form a channel 25 for retaining a plurality of turns of electrically insulated wire forming a coil 26. A first insulating tape 27 surrounds coil 26 and encloses the coil within channel 25. A shielding foil 28 surrounds the outer periphery of insulating tape 27 while a second insulating tape 29 surrounds the foil 28. The insulating tapes 27 and 29 provide desirable electrical insulation about the coil 26 in conjuction with the insulating bobbin 19 while the shielding foil 28 provides desirable immunity from extraneous magnetic flux.

A pair of insulated electrical leads 30 and 31 are joined together to form a cable 32 which is connected to a portion of the outer surface of insulating tape 29 and secured thereto by an outer binding tape 33. The electrical leads 30 and 31 are joined to opposite ends of coil 26 as at 34.

A cable support 35 includes a first portion 36 having an opening therein which surrounds the threaded portion of screw 17 and is held in firm engagement with leg 13 by a head 37 provided by screw 17. A clasp 38 is connected to cable 32 and is supported by portion 38 through arm 39.

A member 40 formed of plastic foam or the like having good electrical insulating properties is firmly attached to the outer insulating tape 29, to binding tape 33, and to the axial members 21 and 22 of bobbin 19. The insulating member 40 is thus carried by bobbin 19 and removably engages an identically constructed foam member 41 which is secured to base 12 and the pair of spaced legs 13 and 14. The foam member 40 thus removably engages the foam member 41 and the pair of spaced legs 13 and 14 to surround and secure the lead 4.

When attaching sensor 6 to lead 4 for a sensing operation, the screw 17 is removed and the assembly including bobbin 19, including coil 26 and insulating foam member 40 is removed from the U-shaped bracket 11. The lead 4 is placed in engagement with foam member 41 in spaced relationship with the legs 13 and 14. The bobbin 19 is thereafter inserted into bracket 11 with opening 24 being aligned with openings 15 and 16. The screw 17 is thereafter inserted to securely retain the assembly. The foam member 40 thus tightly engages the foam member 41 and completely surrounds lead 4. The flow of energy through conductor 4 induces magnetic flux through a closed loop circuit comprising the U-shaped bracket member 11, the screw 17 and possibly the bracket portion 36. The flow of magnetic flux through screw 17 induces a current flow within coil 26 which is conducted to the sensor circuit 7 through leads 30 and 31. The coil 26 may be designed so that a relatively small signal may be generated in response to a large current flow through lead 4. Yet, such small signal is directly proportional to the sensed large current flow over a substantial range of operating conditions.

The sensor 6 is particularly sensitive to signal deviations flowing within the electrical lead 4. The sensor, when assembled onto an electrical lead such as 4, is maintained in a rigid condition for reliable operation over a prolonged period of time. The energy flow through a lead such as 4, is sensed without piercing the insulation surrounding such lead or without severing the lead for the insertion of external sensing circuitry such as transformer coils, sensing resistors or the like. The sensing coil 26 is uniquely retained in a well insulated manner to prevent erroneous signals from being induced therein.

Various modes of carrying out the invention are contemplated as being within the scope of the following claims, particularly pointing out and distinctly claiming the subject matter which is regarded as the invention.

I claim:

1. A removable energy sensor for monitoring the flow of electrical energy through a current carrying conductor, said sensor comprising:
    (a) a generally U-shaped flux conducting bracket for receiving a said conductor therethrough and having an inner end portion closed by a base portion which joins a pair of spaced outwardly directed legs terminating in an open outer end portion remote from said base portion,
    (b) a removable assembly extending between said legs adjacent the said open outer end portion of said bracket, said assembly including:
        (1) an insulator extending between said legs,
        (2) and a coil of electrically conductive wire mounted on said insulator and with said wire having at least one output lead for providing an output signal substantially proportional to current flow through the said current carrying conductor,
    (c) and a removable flux conducting retainer member mounting said assembly to said legs,
    (d) said retainer member extending through said assembly and forming, together with said U-shaped bracket, a closed loop circuit for conducting flux about the said conductor in response to current flow through the said conductor.

2. The sensor of claim 1:
    (a) wherein said legs include aligned openings therein,
    (b) and said retainer member extends through said openings to hold said assembly in place.

3. The sensor of claim 1 or 2:
    (a) wherein said insulator comprises a removable bobbin having a central core and a pair of end members on said core with said end members disposed between said legs,
    (b) said coil being wrapped around said core.

4. The sensor of claim 3 wherein said retainer member extends through said central core and within said coil.

5. The sensor of claim 4 which includes means for suspending the said current carrying conductor between said inner end portion of said bracket and said assembly, said suspending means comprising:
    (a) a first insulating member disposed within the inner end portion of said bracket and secured thereto, (b) and a second insulating member forming part of said removable assembly, (c) said first and second insulating members sandwiching the said current carrying conductor therebetween when said assembly is mounted to said bracket by said retainer member.

6. The sensor of claim 5 in which said removable assembly includes:

(a) a first insulating tape surrounding the outer periphery of said coil between said end members of said bobbin, (b) a shielding foil member substantially surrounding said first insulating tape, (c) and a second insulating tape substantially surrounding said metal foil, (d) said second insulating member being attached to said second insulating tape.

* * * * *